Dec. 20, 1966 J. NICKL 3,293,074

METHOD AND APPARATUS FOR GROWING MONOCRYSTALLINE LAYERS ON MONOCRYSTALLINE SUBSTRATES OF SEMICONDUCTOR MATERIAL

Filed Nov. 4, 1964 2 Sheets-Sheet 1

United States Patent Office 3,293,074

Patented Dec. 20, 1966

3,293,074

METHOD AND APPARATUS FOR GROWING MONOCRYSTALLINE LAYERS ON MONOCRYSTALLINE SUBSTRATES OF SEMICONDUCTOR MATERIAL

Julius Nickl, Munich, Germany, assignor to Siemens & Halske Aktiengesellschaft, Berlin, Germany, a corporation of Germany Filed Nov. 4, 1964, Ser. No. 409,025
Claims priority, application Germany, Nov. 5, 1963, S 88,180
16 Claims. (Cl. 117—201)

Figure 1:
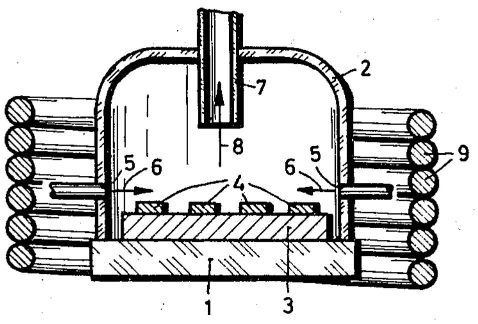

My invention relates to the production of epitaxially grown monocrystalline layers of semiconductor material on monocrystalline substrates, preferably wafers or discs, of semiconductor material by thermal dissociation of a gaseous semiconductor compound and precipitation of the evolving semiconductor material upon the substrates, the epitaxial layers having, if desired, a different conductivity and/or different type of conductance from that of the substrate.

Several methods have become known for thus producing monocrystalline epitaxial layers of semiconductor material.

According to one of the known methods, a monocrystalline layer of germanium is grown on a germanium substrate by passing a mixture of hydrogen and gaseous germanium halogenide over the substrate within a reaction vessel and the vessel with its content is heated to a temperature at which the halogenide is thermally dissociated. The walls of the vessel may consist of quartz. For obtaining a monocrystalline layer of a given conductivity, there is added to the germanium halogenide a doping substance which determines the conductance type of the layer.

The known method is also applicable for producing a succession of layers having respectively different conductivity and/or different types of conductivity. By controlling the proportion of the supplied doping substance, the conductivity or specific resistance of the precipitating layer or layers can also be controlled. Recombination centers or adhesion points may thus also be produced in the semiconductor crystal. For example, a graduation in specific conductivity toward the junction between epitaxial layers or away from such junction can be obtained.

When employing these, as well as several other known methods for simultaneously precipitating semiconductor material upon a relatively large number of semiconductor substrates, the epitaxial layers thus grown on the respective substrates have been found to differ in thickness. Sometimes, up to 25% thickness differences have been encountered. Often the precipitation on each individual semiconductor substrate is non-uniform, so that the epitaxial layer on a substrate is not planar or not parallel to the substrate surface upon which the layer was grown. In most cases, the epitaxial layers must be lapped or chemically etched to planar shape, before they are suitable for further fabrication into semiconductor devices. As a rule, such additional processing makes it almost inevitable that the semiconductor member becomes contaminated by the tools or chemical agents employed, so that the electrical properties are impaired. It has also been observed that the precipitated epitaxial layers become contaminated by substances stemming from the walls of the reaction vessels, the type and quantity of contaminating impurities varying from charge to charge. This greatly aggravates the production of epitaxial layers of accurately reproducible properties.

It is an object of my invention to obviate or greatly minimize the above-mentioned disadvantages and to secure a uniformly thick deposition of epitaxially grown layers on a multiplicity of simultaneously processed substrates as well as on individual substrates.

According to the invention, the gaseous compound of the semiconductor material, preferably mixed with hydrogen or other carrier gas, is supplied into the pyrolytic reaction chamber through a plurality of inlet openings which are arranged to pass respective gas currents along the substrate surfaces in different directions toward the middle of the substrate arrangement, and the reaction gases are removed from the processing chamber at a locality substantially above the middle of the substrate arrangement.

It is particularly preferable to place the substrates upon a carrier body of the same semiconductor material for the purpose of avoiding contamination of the substrates.

According to another feature of the invention, several substrates of semiconductor material are placed upon an elongated carrier body. The substrates may consist of elemental semiconductors such as germanium or silicon, or also of semiconducting compounds, for example $A^{III}B^{V}$ semiconductor compounds. In this method, the supporting carrier body with the substrates on top, is preferably placed lengthwise into a cylindrical or tubular reaction vessel whose walls may consist of quartz and the reaction gas is supplied from both axial ends of the vessel, whereas the outlet for the reaction waste gases is located approximately above the middle of the carrier body.

According to another feature of the invention, the gas outlet, preferably consisting of a quartz tube, protrudes downwardly into the reaction chamber so that the removal of the spent gas takes place closely above the substrates. The heating of the substrates to the pyrolytic dissociation temperature of the gaseous semiconductor compound may be effected, for example, by placing the reaction vessel into a tubular furnace, and the heat may be transferred in the furnace essentially by radiation.

According to a preferred embodiment of the method according to the invention, the thermal dissociation of the gaseous semiconductor compound, preferably used in mixture with carrier gas, and the precipitation of the semiconductor material upon the substrates, are carried out in a reaction chamber formed by a base plate and a bell vacuum-tightly seated upon the base plate. In this case, the reaction gas is supplied through lateral inlet openings in the cylindrical wall of the bell, and the reaction waste gases are withdrawn approximately above the middle of the base plate through the top of the bell. The base plate as well as the bell may consist of quartz.

The above-mentioned and further objects, advantages and features of my invention, said features being set forth with particularity in the claims annexed hereto, will be apparent from, and will be mentioned in, the following with reference to embodiments of processing apparatus according to the invention illustrated by way of example on the accompanying drawings in which:

FIGS. 1 to 5 show respectively five different devices for the pyrolytic production of epitaxial films or layers of semiconductor material upon semiconductor substrate wafers, each being illustrated in vertical section. The same reference numerals are used in all illustrations for corresponding components respectively.

The apparatus according to FIG. 1 comprises a base plate 1 of quartz on which a bell 2, also consisting of quartz, is vacuum-tightly seated. A carrier body 3 is placed on the planar top surface of the base plate. The body preferably consists of the same semiconductor material as the substrates, for example silicon. A number of substrates 4, each consisting of a flat wafer or circular disc of silicon, are placed on top of the carrier body 3. The bell 2 has gas inlet ducts 5 in its lateral wall approximately at the height of the substrates. During the process, the gaseous compound of the semiconductor material, symbolically illustrated by arrows 6, is blown into the reaction chamber. The gaseous compound may consist of silicochloroform and is preferably mixed with argon or hydrogen. For example, a mixture of silicochloroform and hydrogen in the ratio of 1:10 is used. Each of the inlet openings thus supplies a current of the gaseous atmosphere from the inner periphery of the bell in a substantially radial direction along a portion of the substrate arrangement to be epitaxially coated. Although only four substrates and only two inlet openings 5 are shown in FIG. 1, it will be understood that a larger number of substrates are usually employed and that more than two inlet openings are preferably distributed uniformly about the circumference.

If the carrier body 3 does not have circular but elongated shape and a single row of substrates is placed lengthwise upon the carrier body, only the illustrated two openings 5 are needed and these are then preferably located diagonally opposite each other in alignment with the carrier body 3.

Generally, however, the carrier body may have any desired shape and is preferably given the shape of a circular disc corresponding to that of the base plate. This renders the process more economical because the equipment is better utilized during each processing run.

An outlet duct 7 for the reaction waste gases, these being symbolically represented by an arrow 8, passes through the top of the bell 2 substantially above the middle of the base plate 1. Each inlet opening supplies reaction gas essentially to only a portion of the substrates to be epitaxially coated, and thus reaches the surface of the individual substrates in fresh condition. As a result, the gaseous compound is particularly well utilized, and virtually the same layer thickness of the precipitating coating is secured for all substrates. The outlet duct 7, consisting preferably of a quartz tube, protrudes downwardly into the reaction chamber within the bell 2. While this is not absolutely necessary, it improves the gas flow conditions to promote securing the desired results mentioned above.

The substrates are heated to the pyrolytic dissociation temperature of the gaseous semiconductor compound in any suitable manner. In the illustrated embodiment, such heating is effected by means of an induction heater coil 9 energized from a high-frequency current source (not illustrated). For precipitating silicon by thermal dissociation of an atmosphere composed of silicochloroform mixed with hydrogen in the ratio of about 1:10, it is advisable to adjust the surface temperature of the silicon substrates to about 1100 to 1350° C. In lieu of hydrogen, other carrier gases can be used, for example argon, a mixture of hydrogen with argon, or a mixture of hydrogen with another non-oxidizing gas. The temperature of the substrates is preferably adjusted in dependence upon the composition of the reaction gas but, as a rule, remains within the above-mentioned temperature limits.

Figure 4:
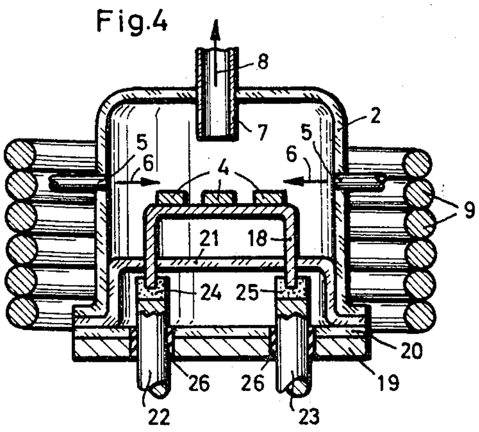

The heating of the substrates to the dissociation temperature of the gaseous semiconductor compound may also be effected by heat transfer from the carrier body which may then be heated by directly passing current through the carrier body. For this purpose the carrier body may be given a U-shaped design. In such an embodiment, it is advisable to separate the reaction chamber proper by a quartz plate from an antechamber in which the holders for the U-shaped carrier body and the current-supply terminals are located, the main portion of the carrier body with the substrates being disposed in the reaction chamber. Such a partitioning quartz plate prevents contamination of the precipitating silicon by impurities which, at the high temperatures required for the pyrolytic dissociation, especially in the case of silicon, may vaporize out of the holders and current-supply terminals of the carrier body. An embodiment of this type is shown in FIG. 4 to be described in a later place.

Figure 2:
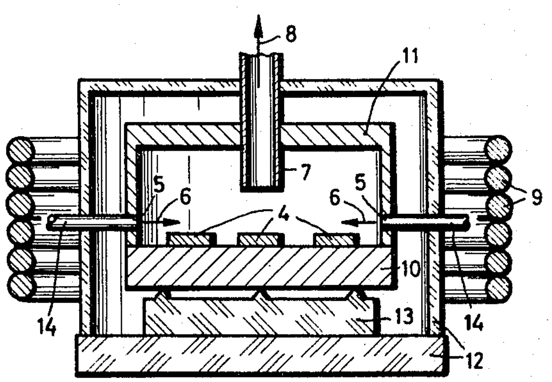

According to another, particularly favorable embodiment of the invention, represented in FIG. 2, the wall of the reaction chamber proper is made of the same hyperpure material of which the semiconductor substrates consist. In this case, an additional carrier body can be dispensed with. As shown in FIG. 2, the semiconductor substrates 4, for example of silicon, or if desired only a single substrate, are placed on top of the base plate 10 which simultaneously serves as carrier body and consists of hyperpure silicon. The base plate is vacuum-tightly engaged by a bell 11 also consisting of silicon. Particularly favorable thermal conditions are achieved if the base plate 10 is given a rather massive design because this secures good temperature stability which further improves the uniformity of the epitaxial coatings produced. The lateral wall of the ball 11 has the above-mentioned openings 5 for the supply of the reaction gas such as silicochloroform or silicontetrachloride, mixed with a carrier gas such as hydrogen. The incoming gas flow is represented symbolically by arrows 6. A tube 7 for removing the reaction waste gases passes through the top of the bell 11, the flow of waste gases being represented symbolically by an arrow 8. The outlet tube 7 which, in the illustrated embodiment, protrudes downwardly into the reaction chamber, preferably consists of the same semiconductor material as the substrates. In this manner, a contamination of the semiconductor substrates or of the epitaxially growing layers by substances that may vaporize from the walls of the reaction chamber is reliably prevented.

According to FIG. 2, the bell 11 consists of a single piece. For technological reasons, however, it is often preferable to compose the bell of several parts and to vacuum-tightly join them with each other. For example, the bell may consist of a planar top plate of circular shape and a cylindrical wall portion cemented together with the top plate.

For preventing oxidation of the silicon walls of the components from the reaction chamber, the device is enclosed with lateral clearance within an outer quartz vessel 12. The heating of the substrates to the dissociation temperature of the gaseous semiconductor compound is effected by means of an induction heater coil 9 to be energized by high-frequency current. The outer enclosure comprises a base 13 of quartz upon which the base plate 10 is mounted. The reaction gas is supplied to the openings 5 by tubes 14 which likewise consist of quartz and extend through the cylindrical wall of the outer quartz vessel 12.

Embodiments of the type exemplified by FIG. 2 may be modified in various ways. For example, the reaction gas may be supplied through the bottom of the outer quartz vessel 12 and then pass along the inner walls of vessel 12 before it enters through the openings 5 into the reaction chamber proper. In this case, the tubes 14 are not necessary because the gas passes directly through the openings 5 into the reaction chamber. It is particularly advantageous in the latter embodiment, to cool the walls of the vessel 12 to prevent impurities from vaporizing out of the wall. Such cooling of the vessel wall is particularly advisable at high operating temperatures, such as those required for epitaxial precipitation of silicon. The necessary cooling can be effected by giving the walls, particularly the lateral walls of vessel 12, a hollow design and to have the interior traversed by coolant gas.

In many cases it is also preferable to cool the walls of the inner reaction vessel 11 by passing inert gas or the fresh reaction gas through the interspace between the outer quartz vessel 12 and the wall of the inner vessel 11.

Argon or nitrogen are suitable as inert coolant. When using inert cooling gas, the supply of the reaction gas can then be effected by means of the tubes 14.

Figure 3:
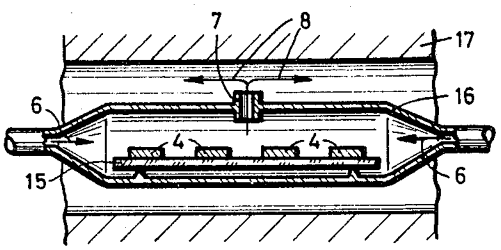
Figure 5:
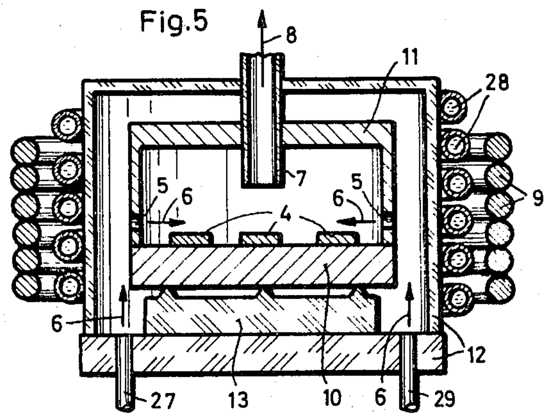

The embodiments of processing apparatus illustrated in FIGS. 3, 4 and 5 correspond to the various modifications mentioned in the foregoing.

According to FIG. 3, the substrates 4 of semiconductor material are placed on top of an elongated carrier body 15 consisting of quartz. The carrier body 15 is inserted into a tubular reaction vessel 16 whose walls likewise consist of quartz. The heating of the substrates is effected by radiation with the aid of the tubular furnace 17 into which the reaction vessel is inserted.

The processing apparatus according to FIG. 4 is equipped with a U-shaped carrier body 18 which is heated by directly passing electric current through the body. The reaction vessel comprises a quartz bell 2 and a metallic base plate 19, formed for example of copper or silver, which is cooled for example with water. A quartz plate 20 is placed on top of the metallic base plate 19. The reaction chamber proper, in which the carrier body 18 and the substrates 4 are located, is separated from an antechamber by a cup-shaped partition 21. The two legs of the carrier body 18 pass vacuum-tightly through the partition 21. Located in the antechamber are the current-supply terminals 22 and 23 for the respective legs of the carrier body 18, as well as the holders 24 and 25 in which the ends of the legs are fastened. The holders 24 and 25 may consist of carbon, low-ohmic silicon, or they may be coated with silicon. Preferably used are holders of carbon or graphite with a silicon coating. The current-supply terminals 22 and 23, preferably made of copper, pass through the base plate 19 and the quartz plate 20 and are insulated therefrom by insulating sealing sleeves 26. During the epitaxial precipitation process, a voltage is impressed between the legs of the U-shaped carrier body 18 so that the current passing through the body heats the substrates to the dissociation temperature of the gaseous semiconductor compound.

In the embodiment shown in FIG. 5, the fresh reaction gas is supplied through tubes 27 and 29 which pass through the base plate of the outer vessel 12 corresponding otherwise essentially to FIG. 2. The gas then travels along the walls of vessels 11 and 12 in the interspace between these two vessels before it passes through the inlet openings 5 into the reaction chamber proper. The walls of the outer vessel 12 are further cooled by a tubular cooling coil 28 traversed by water or other coolant. In other respects, this embodiment corresponds to that of FIG. 2.

As mentioned, the ducts 27 and 29 may also be used for supplying a coolant gas into the interspace between the two vessels 11 and 12, whereas the reaction gas is supplied to the reaction chamber within vessel 12 by tubes 14 in the same manner as shown in FIG. 2. This requires providing openings in the top portion of the outer vessel 12 through which the coolant gas may escape. When thus employing a coolant gas in the interspace between vessels 11 and 12, it may be unnecessary to provide for cooling of the outer vessel 12 by means of a cooling coil 28.

Upon a study of this disclosure it will be obvious to those skilled in the art that my invention is amenable to various other modifications and hence can be given embodiments other than particularly illustrated and described herein, without departing from the essential features of the invention and within the scope of the claims annexed hereto.

I claim:

1. The method of epitaxially growing monocrystalline semiconductor layers upon disc-shaped electrodeless monocrystalline semiconductor substrates by thermal dissociation of gaseous semiconductor compound and precipitating the evolving semiconductor material upon the substrates in a reaction vessel having gas inlet and outlet openings, which comprises passing a gaseous flow containing said compound from a plurality of inlet openings parallel to the substrate surfaces which are to be coated while heating the substrates to the dissociation temperature of the compound, and removing the residual reaction gas from a locality substantially above the middle of the substrates.

2. The method of epitaxially growing monocrystalline semiconductor layers upon disc-shaped electrodeless monocrystalline semiconductor substrates by thermal dissociation of gaseous semiconductor compound and precipitating the evolving semiconductor material upon the substrates in a reaction vessel having gas inlet and outlet openings, which comprises placing the semiconductor substrates flat on top of a carrier body of the same semiconductor material, passing a gaseous flow containing said semiconductor compound from respectively different directions parallel to, along the top and toward the middle of the carrier body while simultaneously maintaining the substrates at the dissociation temperature of the compound, and removing the residual reaction gas from a locality substantially above the middle of the carrier body.

3. The method of epitaxially growing monocrystalline semiconductor layers upon disc-shaped electrodeless monocrystalline semiconductor substrates by thermal dissociation of gaseous semiconductor compound and precipitating the evolving semiconductor material upon the substrates in a reaction vessel having gas inlet and outlet openings, which comprises placing a row of semiconductor substrates lengthwise on top of an elongated carrier body of the same semiconductor material, passing a gaseous flow containing said semiconductor compound from opposite directions parallel to and along the substrate row in respective directions from the body ends toward the middle while simultaneously maintaining the substrates at the dissociation temperature of the compound, and removing the residual reaction gas from a locality substantially above the middle of the carrier body.

4. The method according to claim 1, wherein the substrates in the reaction vessel are heated to said dissociation temperature by radiation from the outside through the wall of the reaction vessel.

5. The method according to claim 2, wherein the substrates in the reaction vessel are heated to said dissociation temperature by heat conductance from said carrier body.

6. Apparatus for growing monocrystalline semiconductor layers upon monocrystalline semiconductor substrates by thermal dissociation of gaseous semiconductor compound and precipitating the evolving semiconductor material upon the substrates, comprising a reaction vessel having a sealed reaction chamber, a horizontal planar top surface in said chamber for accommodating the substrates on said top surface, said vessel having a plurality of lateral gas inlet openings disposed at about the height of said top surface and spaced from each other to blow respective currents of reaction gas from different directions along said top surface toward the middle thereof, said vessel having a top portion provided with a gas outlet above the middle of said top surface for removing spent reaction gases, and means for heating the substrates on said top surface.

7. Apparatus for growing monocrystalline semiconductor layers upon monocrystalline semiconductor substrates by thermal dissociation of gaseous semiconductor compound and precipitating the evolving semiconductor material upon the substrates comprising a tubular reaction vessel, having a tubular wall and two tube ends, the axis of the reaction vessel passing through the two tube ends being substantially horizontal, a carrier body having a planar top surface extending in said vessel parallel to said axis for accommodating the substrates on said top surface, said vessel having respective gas inlet openings at the two tube ends and having a gas outlet in the tubular wall above the middle of said carrier body so that reaction gas supplied through said inlet openings passes from different directions along said top surface toward the middle and waste gases are removed through said outlet, and means for heating the substrates on said top surface to the dissociation temperature of the reaction gas.

8. Apparatus for growing monocrystalline semiconductor layers upon monocrystalline semiconductor substrates by thermal dissociation of gaseous semiconductor compound and precipitating the evolving semiconductor material upon the substrates, comprising a reaction vessel having a sealed bell and forming a reaction chamber in said bell, a structure having a planar horizontal top surface in said chamber for accommodating the substrates on said top surface, said bell having a plurality of lateral gas inlet openings circumferentially distributed at about the height of said top surface for blowing respective currents of reaction gas from different directions along said top surface toward the middle thereof, said vessel having a gas outlet in the top portion of said bell above the middle of said top surface for removing spent reaction gases, and means for heating the substrates on said top surface.

9. In apparatus according to claim 8, said bell and said structure consisting of quartz.

10. In apparatus according to claim 6, said structure forming a base plate on which said bell is seated, said bell and said base-plate structure being formed of the same semiconductor material as the substrates, and an outer vessel surrounding said reaction vessel with lateral clearance.

11. In apparatus according to claim 10, said outer vessel consisting of quartz.

12. In apparatus according to claim 8, said gas outlet comprising an outlet tube passing through said bell and protruding downwardly from the bell top into said chamber.

13. In apparatus according to claim 12, said bell and said outlet tube consisting of quartz.

14. In apparatus according to claim 12, said outlet tube consisting of the same semiconductor material as the substrates.

15. Apparatus according to claim 6, comprising coolant circulation means for cooling the walls of said reaction vessel.

16. Apparatus according to claim 10, comprising duct means communicating with the interspace between said reaction vessel and said outer vessel for cooling the vessel walls by cooling medium passing through said interspace.

References Cited by the Examiner

UNITED STATES PATENTS 2,880,117 3/1959 Hanlet ------------- 117—106
3,053,638 9/1962 Reiser.

FOREIGN PATENTS 1,151,782 7/1963 Germany.
749,293 5/1956 Great Britain.

RALPH S. KENDALL, *Primary Examiner.*

RICHARD D. NEVIUS, *Examiner.*

J. P. McINTOSH, *Assistant Examiner.*